United States Patent
Berggren et al.

(10) Patent No.: US 10,847,573 B1
(45) Date of Patent: Nov. 24, 2020

(54) METHOD FOR PRODUCING SQUID ARRAYS COMPOSED OF SQUID ELEMENTS HAVING LARGE SPREAD IN MAGNETIC INDUCTANCE VALUES AND COMPARABLE INTERNAL DIMENSIONS

(71) Applicant: Naval Information Warfare Center, Pacific, San Diego, CA (US)

(72) Inventors: Susan Anne Elizabeth Berggren, San Diego, CA (US); Benjamin J. Taylor, Escondido, CA (US)

(73) Assignee: United States of America as Represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 16/786,659

(22) Filed: Feb. 10, 2020

(51) Int. Cl.
*H01L 27/18* (2006.01)
*H01L 39/02* (2006.01)
*H03K 19/195* (2006.01)
*H01L 39/22* (2006.01)
*H01L 39/24* (2006.01)

(52) U.S. Cl.
CPC ............ *H01L 27/18* (2013.01); *H01L 39/025* (2013.01); *H01L 39/223* (2013.01); *H01L 39/2419* (2013.01); *H03K 19/195* (2013.01)

(58) Field of Classification Search
CPC .............................. H01L 27/18; H01L 39/025
See application file for complete search history.

(56) References Cited

U.S. PATENT DOCUMENTS

| | | | |
|---|---|---|---|
| 5,487,304 A | 1/1996 | Sanzari | |
| 8,933,695 B1 | 1/2015 | Kernev et al. | |
| 9,097,751 B1 * | 8/2015 | Longhini | G01R 33/0354 |
| 9,588,191 B1 | 3/2017 | Kornev et al. | |
| 9,664,751 B1 * | 5/2017 | Berggren | G01R 33/0354 |
| 10,078,118 B2 | 9/2018 | Berggren et al. | |

(Continued)

OTHER PUBLICATIONS

Oppenländer et al., "Superconducting Multiple LoopQuantum Interferometers," IEEE Trans. on Appl. Supercond., 11, 1271 (2001).

(Continued)

*Primary Examiner* — Reena Aurora
(74) *Attorney, Agent, or Firm* — Naval Information Warfare Center Pacific; Kyle Eppele; James McGee

(57) ABSTRACT

A device is disclosed that includes a substrate, a first superconducting quantum interference device (SQUID), a second SQUID and a third SQUID. The first SQUID is disposed on the substrate and has a first feature dimension, a second feature dimension and a first effective geometric magnetic inductance parameter value, $\beta_{L1}$. The second SQUID is disposed on the substrate and has the first feature dimension, a third feature dimension and a second effective geometric magnetic inductance parameter value, $\beta_{L2}$. The third SQUID is disposed on the substrate and has the first feature dimension, a fourth feature dimension and a third effective geometric magnetic inductance parameter value, $\beta_{L3}$, wherein $\beta_{L1} < \beta_{L2} < \beta_{L3}$.

20 Claims, 7 Drawing Sheets

(56) References Cited

U.S. PATENT DOCUMENTS

| | | | |
|---|---|---|---|
| 10,175,308 B1 | 1/2019 | Berggren et al. | |
| 10,274,548 B2* | 4/2019 | Berggren | G01R 33/0354 |
| 10,514,429 B2* | 12/2019 | Berggren | G01R 33/0094 |
| 2011/0065585 A1* | 3/2011 | Lanting | G01R 33/0094 |
| | | | 505/162 |

OTHER PUBLICATIONS

S. Berggren; "Computational and mathematical modeling of coupled superconducting quantum interference devices," Ph.D. dissertation, San Diego State University (2012).

Prokopenko et al., "Dc and rf measurements of serial bi-squid arrays," IEEE Trans. on Appl. Supercond., 23, 1400607 (2013).

Berggren et al., "Development of 2D bi-SQUID Arrays with High Linearity." IEEE Trans. on Appl. Supercond. 23, 1400208 (2013).

Kornev et al., "Bi-SQUID: a novel linearization method for dc SQUID voltage response," Supercond. Sci. and Tech., 22, 114011 (2009).

Berggren et al., "Modeling the effects of fabrication spreads and noise on series coupled arrays of bi-squids," ISEC, 2013 IEEE 14th International, 1-3 (2013).

Longhini et al., "Voltage response of non-uniform arrays of bi-superconductive quantum interference devices," Journal of Applied Physics, 111, 093920 May (2012).

Kornev et al., "Active electrically small antenna based on superconducting quantum array," IEEE Trans. on Appl. Supercond., 23, 1800405 (2013).

Dalichaouch et al., "The effects of mutual inductances in two-dimensional arrays of Josephson junctions," Supercond. Sci. and Tech., 27, 065006 (2014).

Caputo et al., "Superconducting quantum interference filters as absolute magnetic field sensors," IEEE Trans. on Appl. Supercond., 15, 1044-1047 (2005).

* cited by examiner

METHOD FOR PRODUCING SQUID ARRAYS COMPOSED OF SQUID ELEMENTS HAVING LARGE SPREAD IN MAGNETIC INDUCTANCE VALUES AND COMPARABLE INTERNAL DIMENSIONS

FEDERALLY-SPONSORED RESEARCH AND DEVELOPMENT

The United States Government has ownership rights in this invention. Licensing inquiries may be directed to Office of Research and Technical Applications, Naval Information Warfare Center, Pacific, Code 72120, San Diego, Calif., 92152; telephone (619) 553-5118; email: ssc_pac_t2@navy.mil. Reference Navy Case No. 103960.

BACKGROUND OF THE INVENTION

Superconducting Quantum Interference Devices (SQUIDs) are comprised of tiny loops of superconducting material in which Josephson junctions are placed in the loop path. A Josephson junction is a region of material that provides a weak link between two fully superconducting regions. The direct current (DC) SQUID has two symmetrical Josephson junctions. A DC bi-SQUID has one or more Josephson junctions (in series) bisecting the superconducting SQUID loop. This will be described in greater detail with reference to FIGS. 1A-1C.

FIG. 1A illustrates a schematic of a standard DC SQUID 102. As shown in the figure, DC SQUID 102 includes an input port 104, an output port 106, a Josephson junction 108 and a Josephson junction 110. Josephson junction 108 is in parallel with Josephson junction 110.

FIG. 1B illustrates a schematic of a standard DC bi-SQUID 112. As shown in the figure, DC bi-SQUID 112 includes an input port 114, an output port 116, a Josephson junction 118, a Josephson junction 120 and a Josephson junction 122. Josephson junction 118 is in parallel with Josephson junction 120. Josephson junction 122 bisects the superconducting loop created by Josephson junction 118 and Josephson junction 120.

FIG. 1C illustrates a schematic of a multi-(cross) junction bi-SQUID 124. As shown in the figure, multi junction bi-SQUID 124 includes an input port 126, an output port 128, a Josephson junction 130, a Josephson junction 132, a Josephson junction 134 and a Josephson junction 136. Josephson junction 130 is in parallel with Josephson junction 132. Josephson junction 134 is in series with Josephson junction 136, both of which bisect the superconducting loop created by Josephson junction 130 and Josephson junction 132.

Non-uniform arrays of DC SQUIDs (as shown in FIG. 1A) and DC bi-SQUIDs (as shown in FIGS. 1B-C) have been modeled in different array designs and coupling schemes to determine their linearity and sensing capacities and have been fabricated in low temperature superconducting materials.

It has been found that a high linearity of the V-Φ characteristic SQUID array response can be achieved by utilizing a spread of the $\beta_L$ values of individual SQUIDs in a parallel array such that the population (number) of SQUIDs are distributed in a Gaussian manner, where the peak of the distribution is centered on a chosen mean $\beta_L$ value.

Ordinarily, to achieve the desired order of magnitude spread of $\beta_L$ values, the internal area of the SQUID loops in an array are varied by the corresponding order of magnitude. However, there is a difficulty in producing high-$T_c$ SQUID elements with large variation in loop sizes, while still retaining control of the uniformity of the dimensions of the Josephson junctions throughout the entire array wherein the circuit dimensions are formed through a photolithographic process. When the internal areas of the features in the array are varied by an order of magnitude, during the photolithographic exposure process, the smaller areas of the film being removed are overexposed, resulting in Josephson junction widths that are narrower than intended for the corresponding SQUID loops. This results in an undesired spread of critical current values, $I_c$, of the junctions throughout the array. As it is very important to have control over Josephson junction uniformity in order to produce large SQUID arrays having the desired engineered properties, the issue of overexposure presents a limitation to the existing fabrication process.

There exists a need for a SQUID array having a spread of the $\beta_L$ values of individual SQUIDs in a parallel array such that the population (number) of SQUIDs are distributed in a Gaussian manner, where the peak of the distribution is centered on a chosen mean $\beta_L$ value that does not run a risk of overexposure resulting in Josephson junction widths that are narrower than intended for the corresponding SQUID loops.

SUMMARY OF THE INVENTION

An aspect of the present disclosure is drawn to a device that includes a substrate, a first superconducting quantum interference device (SQUID), a second SQUID and a third SQUID. The first SQUID is disposed on the substrate and has a first feature dimension, a second feature dimension and a first effective geometric magnetic inductance parameter value, $\beta_{L1}$. The second SQUID is disposed on the substrate and has the first feature dimension, a third feature dimension and a second effective geometric magnetic inductance parameter value, $\beta_{L2}$. The third SQUID is disposed on the substrate and has the first feature dimension, a fourth feature dimension and a third effective geometric magnetic inductance parameter value, $\beta_{L3}$, wherein $\beta_{L1} < \beta_{L2} < \beta_{L3}$.

BRIEF DESCRIPTION OF THE DRAWINGS

The accompanying drawings, which are incorporated in and form a part of the specification, illustrate example embodiments and, together with the description, serve to explain the principles of the disclosure. A brief summary of the drawings follows.

DETAILED DESCRIPTION OF THE EMBODIMENTS

Aspects of the present disclosure provide a SQUID array having a spread of the $\beta_L$ values of individual SQUIDs such that the population (number) of SQUIDs are distributed in a Gaussian manner, where the peak of the distribution is centered on a chosen mean $\beta_L$ value that does not run a risk of overexposure resulting in Josephson junction widths that are narrower than intended for the corresponding SQUID loops A method in accordance with aspects of the present disclosure produces arrays of high-Temperature (high-$T_c$) SQUIDs via a standard photolithographic process such that the individual SQUID elements have a large spread of magnetic inductance values. The method entails utilizing both SQUID and bi-SQUID elements in the array that have similar internal dimensions, i.e., lithographic features, but also have effective geometric magnetic inductance parameter values, $\beta_L$, varying by up to an order of magnitude. The large variation of the values of $\beta_L$ is necessary to produce a desired strong anti-peak response of the characteristic voltage-magnetic flux (V-$\Phi$) curve. The need for the method described herein arises from the difficulty in producing high-$T_c$ SQUID elements with large variation in loop sizes while still retaining control of the uniformity of the dimensions of the Josephson junctions throughout the entire array wherein the circuit dimensions are formed through a photolithographic process. It is important to note however, that methods described herein are not limited to a step-edge Josephson junction process. Methods discussed herein are, in general, applicable to both low-$T_c$ and high-$T_c$ SQUID array fabrication. A method in accordance with aspects of the present disclosure is most useful in the high-$T_c$ case as it over comes limitations of the lithography as will be described in more detail below.

In order to achieve the order of magnitude spread of the $\beta_L$ values without the limitation of photolithographic exposure variation, in accordance with aspects of the present disclosure, a hybrid array of SQUIDs and bi-SQUIDs take advantage of the high effective $\beta_L$ values of the bi-SQUIDs with respect to that of an ordinary SQUID, while using the same feature dimensions to create the circuit elements. Because the bi-SQUIDs are at the higher end of the $\beta_L$ value distribution, the number of bi-SQUIDs will be balanced by the number of the smallest SQUIDs with respect to the shown Gaussian population distribution. This will be described in greater detail with reference to FIG. 2.

Figure 1:
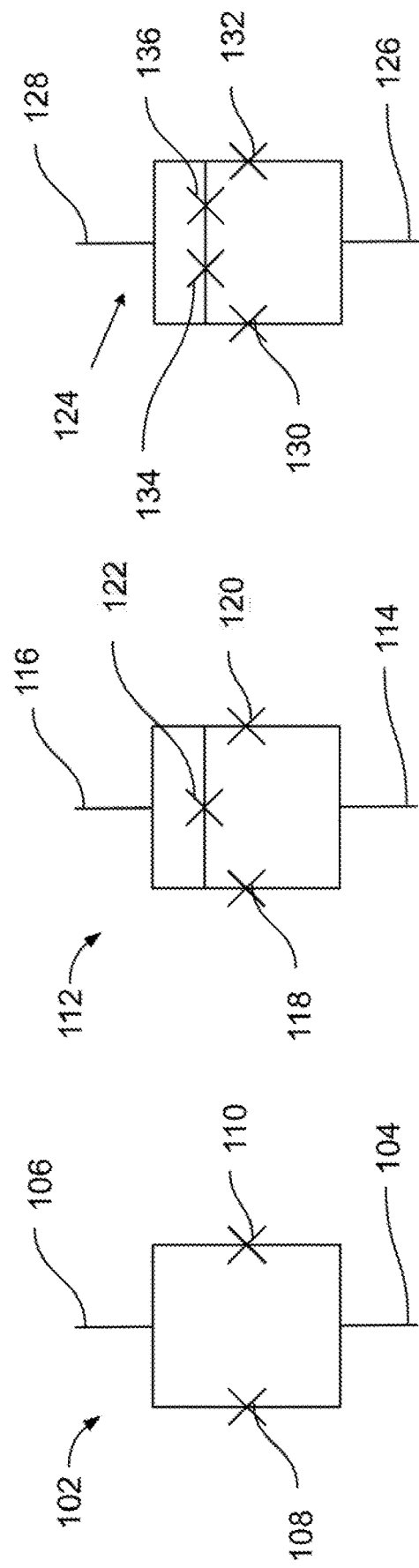
FIG. 1A illustrates a schematic of a standard DC SQUID.
FIG. 1B illustrates a schematic of a standard DC bi-SQUID.
FIG. 1C illustrates a schematic of a multi-(cross) junction bi-SQUID.
Figure 2:
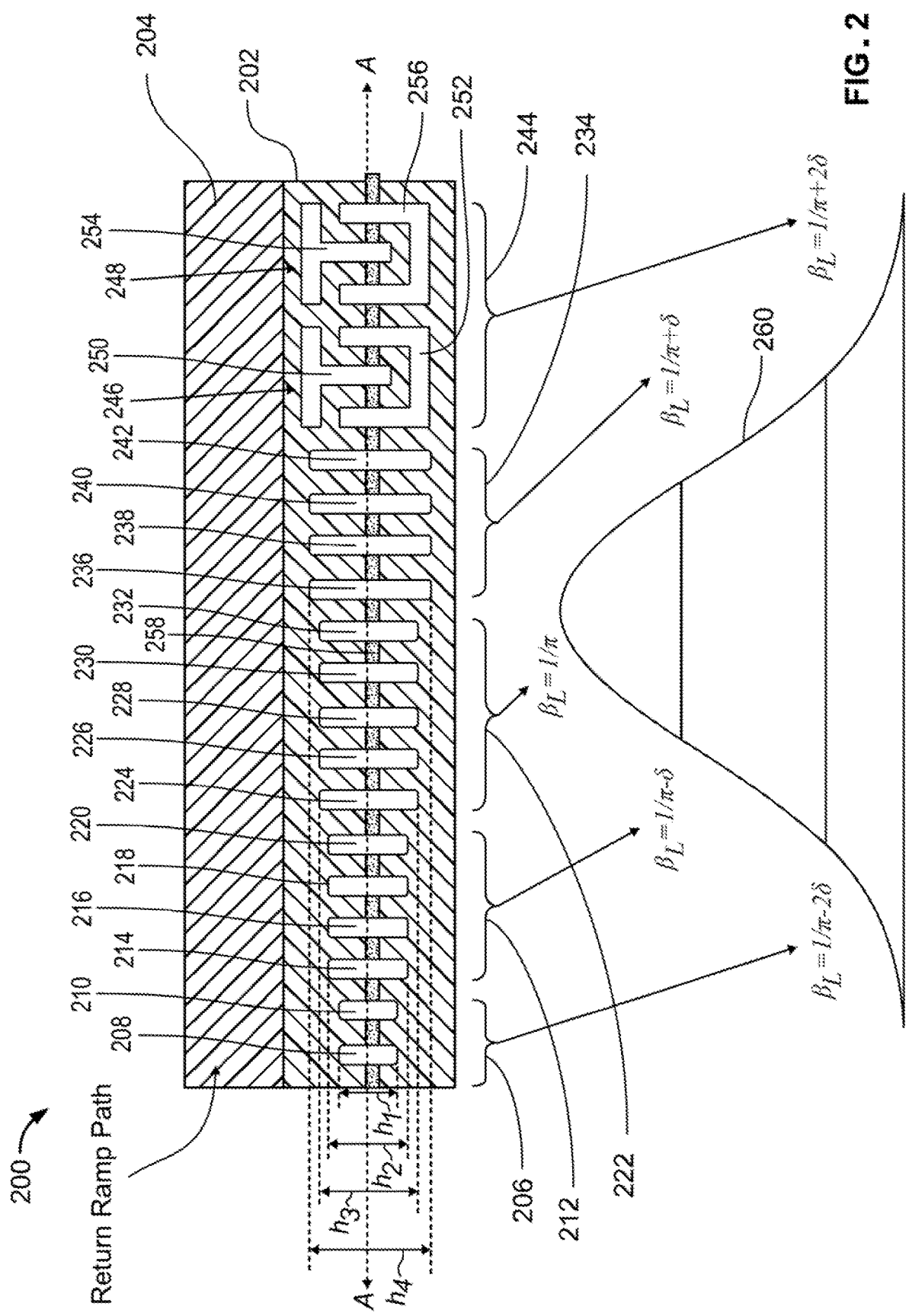
FIG. 2 illustrates a hybrid array of SQUIDs and bi-SQUIDs in accordance with aspects of the present disclosure.

FIG. 2 illustrates a hybrid array 200 of SQUIDs and bi-SQUIDs in accordance with aspects of the present disclosure. As shown in the figure, hybrid array 200 includes an array portion 202 and a return ramp path 204. Array portion 202 includes: a population 206 of SQUIDs 208 and 210; a population 212 of SQUIDs 214, 216, 218 and 220; a population 222 of SQUIDs 224, 226, 228, 230 and 232; a population 234 of SQUIDs 236, 238, 240 and 242; and a population 244 of bi-SQUIDs 246 and 248, wherein bi-SQUID 246 has a t-shaped SQUID feature 250 and a u-shaped SQUID feature 252 and wherein bi-SQUID 248 has a t-shaped SQUID feature 254 and a u-shaped SQUID feature 256.

Adjacent SQUIDs and bi-SQUIDs of hybrid array 200 share Josephson junctions as shown by the dark rectangles, a sample of which is indicated by Josephson junction 258 shared by SQUID 230 and SQUID 232 of population 222.

In operation, the flux from a magnetic field (or the magnetic component of an electromagnetic signal) will pass through the features of each SQUID in array portion 202. An applied DC bias current flows in a distributed manner across all the Josephson junctions in parallel in array portion 202, driving them into a resistive state, wherein a finite voltage can be measured across the direction of bias current flow. The presence of a magnetic field changes the voltage state of each junction in a manner that varies according to the geometric inductance of the associated SQUID, or Bi-SQUID structure in array portion 202. Changes in the voltage output of each SQUID in array portion 202 in parallel then contributes to the net voltage across the parallel SQUID array in array portion 202 in a known manner that provides an absolute measure of the local magnetic field. Subsequently, changes in the voltage across array portion 202 may therefor indicate a magnitude of a detected magnetic field (or electromagnetic signal).

Each SQUID and each bi-SQUID is formed by etching a feature into a superconducting layer. Each SQUID has a feature width and a feature height. More particularly, in accordance with aspects of the present disclosure, each feature shares a same, or substantially common, feature width. The respective effective geometric magnetic inductance parameter values are varied by varying the respective feature heights. In this example: each SQUID in population 206 has a feature height $h_1$; each SQUID in population 212 has a feature height $h_2$; each SQUID in population 222 has a feature height $h_3$; and each SQUID in population 234 has a feature height $h_4$.

In this example, $h_1$ is the smallest height, so each SQUID in population 206 has the smallest effective geometric magnetic inductance parameter value. Similarly, $h_2$ is the second smallest height, so each SQUID in population 212 has the second smallest effective geometric magnetic inductance parameter value. This trend continues through all populations of SQUIDs. Further, the largest effective geometric magnetic inductance parameter value belongs to population 244, which includes the bi-SQUIDs. It should be noted that each element of the bi-SQUIDs of population 244 has a similar cross-sectional width than that of the other SQUIDs in hybrid array 200.

Further, in this example, each Josephson junction shares a same, or substantially common, width. The common feature width and the common Josephson junction width enables a photolithographic exposure process that results in desired spread of critical current values, $I_c$, of the junctions throughout the array, wherein there is no issue of overexposure.

In this example, the array includes populations that have respective effective geometric magnetic inductance parameter values that are arranged in a Gaussian distribution, with the center effective geometric magnetic inductance parameter value, $\beta_L$, being of the largest population. In particular, population 222 includes 5 SQUIDs and has an effective geometric magnetic inductance parameter value, $\beta_L$, of $1/\pi$. Each of populations 212 and 234 has four SQUIDs. Population 212 has an effective geometric magnetic inductance parameter value, $\beta_L$ minus an amount $\delta$, or $1/\pi-\delta$. On the other hand, population 234 has an effective geometric magnetic inductance parameter value, $\beta_L$ plus the amount $\delta$, or $1/\pi+\delta$. Population 206 has only two SQUIDs and population 244 has two bi-SQUIDs. Population 206 has an effective geometric magnetic inductance parameter value, minus an amount $2\delta$, or $1/\pi-2\delta$. On the other hand, population 234 has an effective geometric magnetic inductance parameter value, $\beta_L$ plus the amount $2\delta$, or $1/\pi+2\delta$.

In this example, population 234 is able to provide the relatively large effective geometric magnetic inductance parameter value, $\beta_L$, of $1/\pi+2\delta$ by using bi-SQUIDs.

Curve 260 illustrates the Gaussian distribution of the populations of SQUIDs and bi-SQUIDs with the associated effective geometric magnetic inductance parameter values.

It should be noted that in other embodiments, the populations of SQUIDs and bi-SQUIDs may use other distributions to address high linearity of the V-$\Phi$ characteristic SQUID array response, a non-limiting example of which include a log-normal distribution.

A method of fabricating hybrid array 200 of SQUIDs and bi-SQUIDs in accordance with aspects of the present disclosure will now be described with reference to FIGS. 3A-G.

Figure 3A:
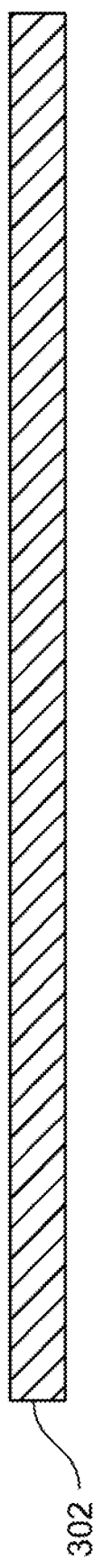
FIGS. 3A-G illustrate respective steps of fabricating the hybrid array of FIG. 2, as viewed through a cross section of FIG. 2 along line A-A.

FIG. 3A illustrates a first step of fabricating hybrid array 200, as viewed through a cross section of FIG. 2 along line A-A. As shown in FIG. 3A, a dielectric substrate 302 is provided. Any known dielectric material may be used, a non-limiting example of which includes $SiO_2$.

Figure 3B:
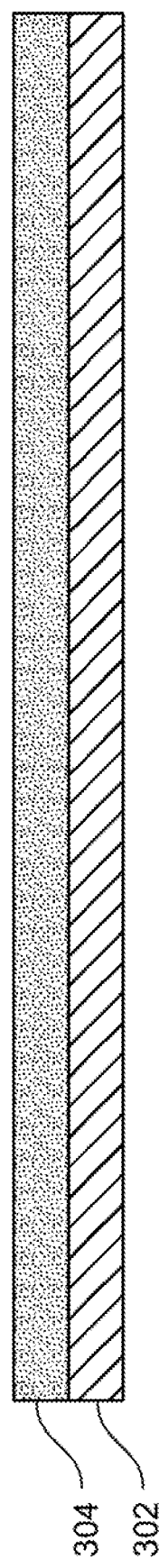

FIG. 3B illustrates a second step of fabricating hybrid array 200, as viewed through the cross section of FIG. 2 along line A-A. As shown in FIG. 3B, a superconducting material layer 304 is provided. Any known superconducting material may be used, non-limiting examples of which include niobium, lead alloy, yttrium barium copper oxide and combination thereof. Superconducting material layer 304 may be disposed on dielectric substrate 202 by any known method, a non-limiting example of which includes chemical vapor deposition.

Figure 3C:
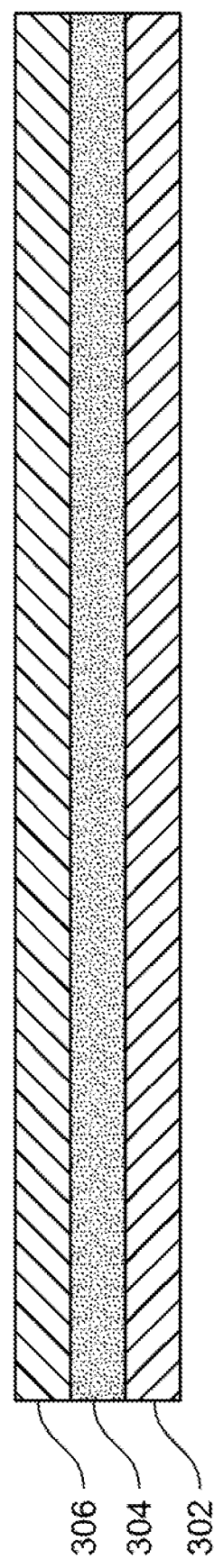

FIG. 3C illustrates a third step of fabricating hybrid array 200, as viewed through the cross section of FIG. 2 along line A-A. As shown in FIG. 3C, a non-superconducting material layer 306 is provided. Non-superconducting material layer 306, as represented herein, includes any combination of layers that function to create a Josephson junction, which is made by sandwiching a thin layer of a non-superconducting material between two layers of superconducting material. Non-superconducting material layer 306 may be disposed on superconducting material layer 304 by any known method, a non-limiting example of which includes chemical vapor deposition.

Figure 3D:
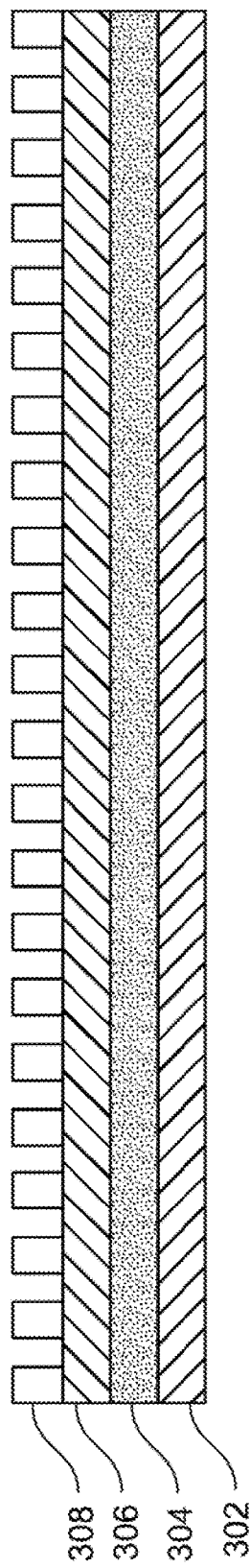

FIG. 3D illustrates a third step of fabricating hybrid array 200, as viewed through the cross section of FIG. 2 along line A-A. As shown in FIG. 3D, a mask 308 is provided. Mask 308 includes any known layer of material that functions to removal of a material not covered by mask 308. For example, in a photolithographic process, a mask would prevent etching of a covered material from exposure to ion radiation, e.g., argon, neon, oxygen, etc., whereas in a chemical etching process, a mask would prevent etching of a covered material from exposure to a chemical liquid or vapor. Mask 308 may be disposed on non-superconducting material layer 306 by any known method, a non-limiting example of which includes chemical vapor deposition.

Figure 3E:
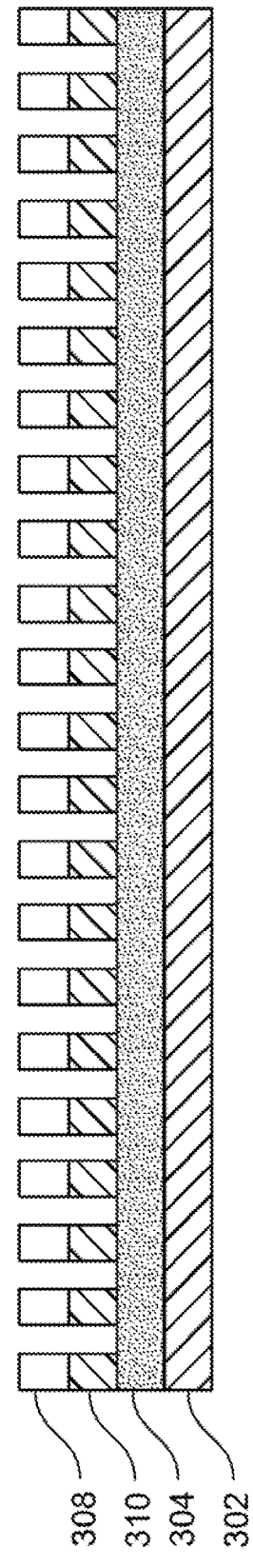

FIG. 3E illustrates a fourth step of fabricating hybrid array 200, as viewed through the cross section of FIG. 2 along line A-A. As shown in FIG. 3E, the portion of non-superconducting material layer 306 that is exposed by mask 308 is etched. Mask 308 includes any known layer of material that functions to removal of a material not covered by mask 308. For example, in a photolithographic process, a mask would prevent etching of a covered material from exposure to ion radiation, whereas in a chemical etching process, a mask would prevent etching of a covered material from exposure to a chemical liquid or vapor. Mask 308 may be disposed on non-superconducting material layer 306 by any known method, a non-limiting example of which includes chemical vapor deposition. This etching of non-superconducting material layer 306 creates the Josephson junctions discussed above with reference to FIG. 2. It should be noted that the creation of the Josephson junctions include a plurality of steps known to those of skill in the art. However, for purposes of brevity, the fabrication step of FIG. 3E is discussed herein as a single step.

Figure 3F:
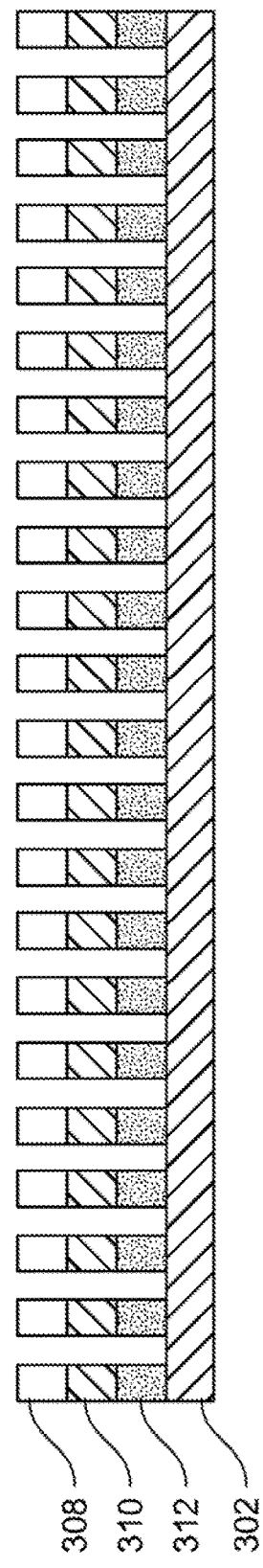

FIG. 3F illustrates a fifth step of fabricating hybrid array 200, as viewed through the cross section of FIG. 2 along line A-A. As shown in FIG. 3F, the portion of superconducting material layer 304 that is exposed by mask 308 is etched. This etching of superconducting material layer 304 creates the features discussed above with reference to FIG. 2, in areas exposed by mask 308, leaving the areas under mask 308 as layer 312. It should be noted that in some embodiments, the etching of FIG. 3E and the etching of FIG. 3F may be performed using different etching techniques and materials as needed and known by those of skill in the art.

Figure 3G:
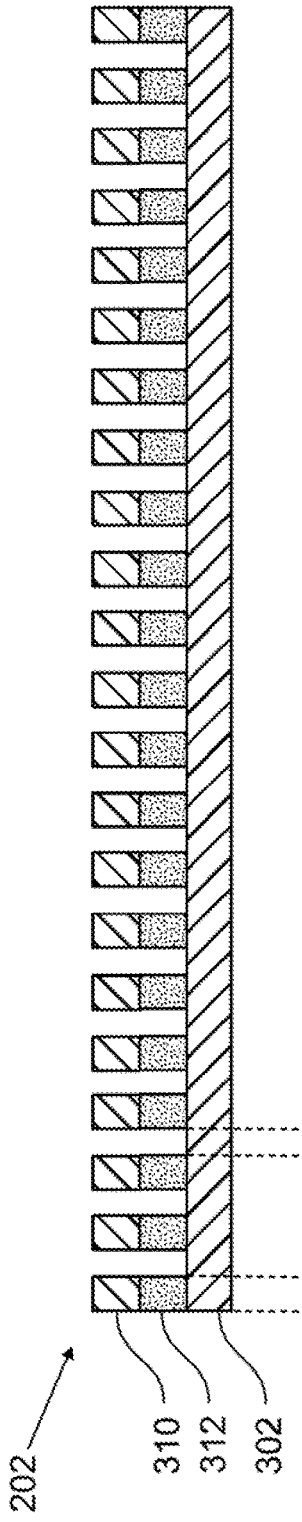

FIG. 3G illustrates a sixth step of fabricating hybrid array 200, as viewed through the cross section of FIG. 2 along line A-A. As shown in FIG. 3G, the mask 308 is removed, by any known method to those of skill in the art. This figure illustrates the final product of array portion 202 as discussed above with reference to FIG. 2. As shown in FIG. 3G, the individual features of all the SQUIDs have a substantially similar feature width, $w_f$, and the Josephson junctions between each respective adjacent set of features have a substantially similar material width, $w_m$.

The example steps for fabricating hybrid array 200 discussed above with reference to FIGS. 3A-G are non-limiting examples. It should be noted that the improvements gained by getting the full order of magnitude of effective geometric magnetic inductance parameter values, $\beta_L$, by utilizing bi-SQUIDs to get the large inductance elements of the array with the same feature sizes as the smallest inductance elements in accordance with aspects of the present disclosure can be utilized by other processes as well. For example, other processes may be used that enable the combination of SQUIDs and bi-SQUIDs in a single array for the full order of magnitude of effective geometric magnetic inductance parameter values, $\beta_L$, with similar feature sizes.

In accordance with aspects of the present disclosure, the heights of the SQUIDs may vary, as shown in FIG. 2. However, as also shown in FIG. 2 and in FIG. 3G, the widths of the SQUIDs and bi-SQUIDs are the same, or substantially similar. Accordingly, there is no difficulty in producing high-$T_c$ SQUID elements with large variation in loop sizes, while still retaining control of the uniformity of the dimensions of the Josephson junctions throughout the entire array wherein the circuit dimensions are formed through a photolithographic process. When the internal areas of the features within the array are varied by an order of magnitude, during the photolithographic exposure process, the smaller areas of the film being removed are not overexposed. This results in Josephson junction widths that are as intended for the corresponding SQUID loops. This results in a desired spread of critical current values, $I_c$, of the junctions throughout the array.

In the non-limiting example embodiment discussed above, the feature width, $w_f$, and the material width, $w_m$, are equal. However, these widths may be different as illustrated in FIGS. 4-5.

Figure 4:
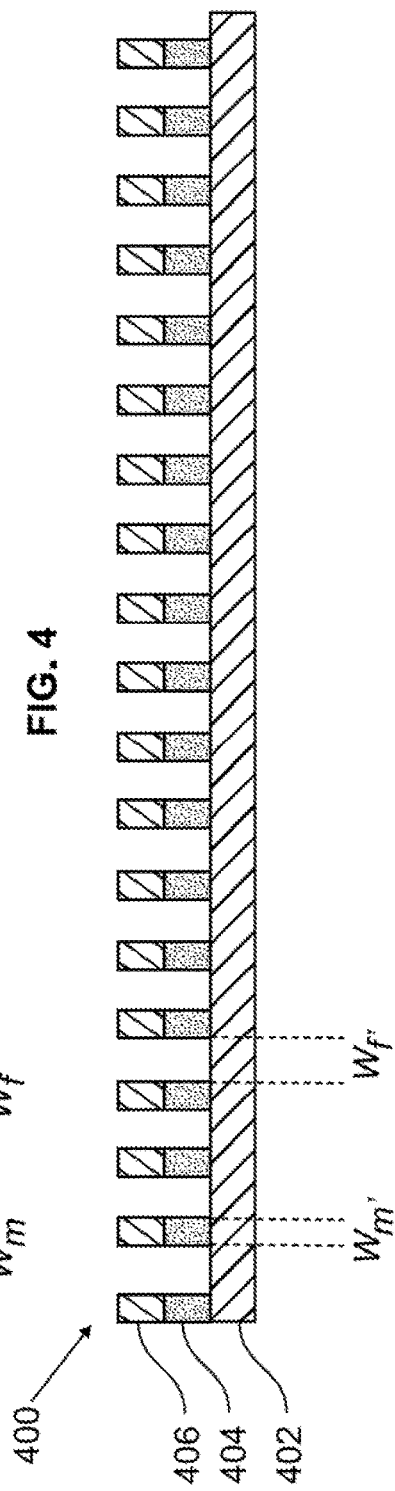
FIG. 4 illustrates a cross sectional view of another example hybrid array in accordance with aspects of the present disclosure.

FIG. 4 illustrates a cross sectional view of another example hybrid array 400, in accordance with aspects of the present disclosure. In this example, the individual features of all the SQUIDs have a substantially similar feature width, $w_f$, and the Josephson junctions between each respective adjacent set of features have a substantially similar material width, $w_{m'}$. As compared with hybrid array 202 of FIG. 3G, in hybrid array 400, the feature width, $w_{f'}$, and the material width, $w_{m'}$, are not equal, wherein $w_{f'} > w_{m'}$. Changing the comparative widths $w_{f'}$ and $w_{m'}$ in this manner would provide hybrid array 400 with different $\beta_L$ values as compared to hybrid array 202.

Figure 5:
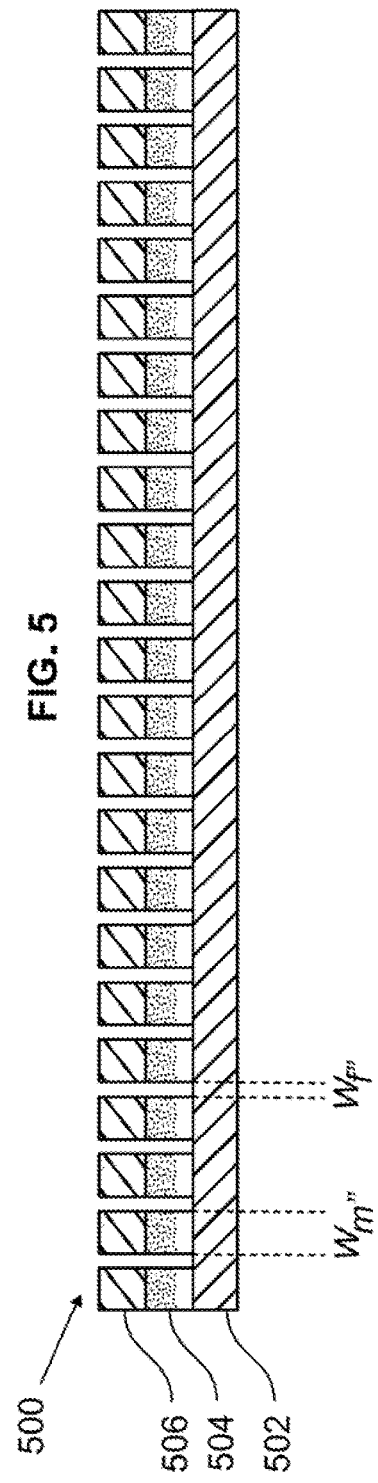
FIG. 5 illustrates a cross sectional view of another example hybrid array in accordance with aspects of the present disclosure.

FIG. 5 illustrates a cross sectional view of another example hybrid array 500, in accordance with aspects of the present disclosure. In this example, the individual features of all the SQUIDs have a substantially similar feature width, $w_{f'}$, and the Josephson junctions between each respective adjacent set of features have a substantially similar material width, $w_{m''}$. As compared with hybrid array 202 of FIG. 3G, in hybrid array 500, the feature width, $w_{f''}$, and the material width, $w_{m''}$, are not equal, wherein $w_{f''} < w_{m''}$. Changing the comparative widths $w_{f''}$ and $w_{m''}$ in this manner would provide hybrid array 500 with different $\beta_L$ values as compared to hybrid array 202 and as compared to hybrid array 400.

The non-limiting example embodiment discussed above with reference to FIG. 2 includes a single hybrid array 200. However, it should be noted that a plurality of hybrid arrays may be implemented in a single system. This will be described in greater detail with reference to FIG. 6.

Figure 6:
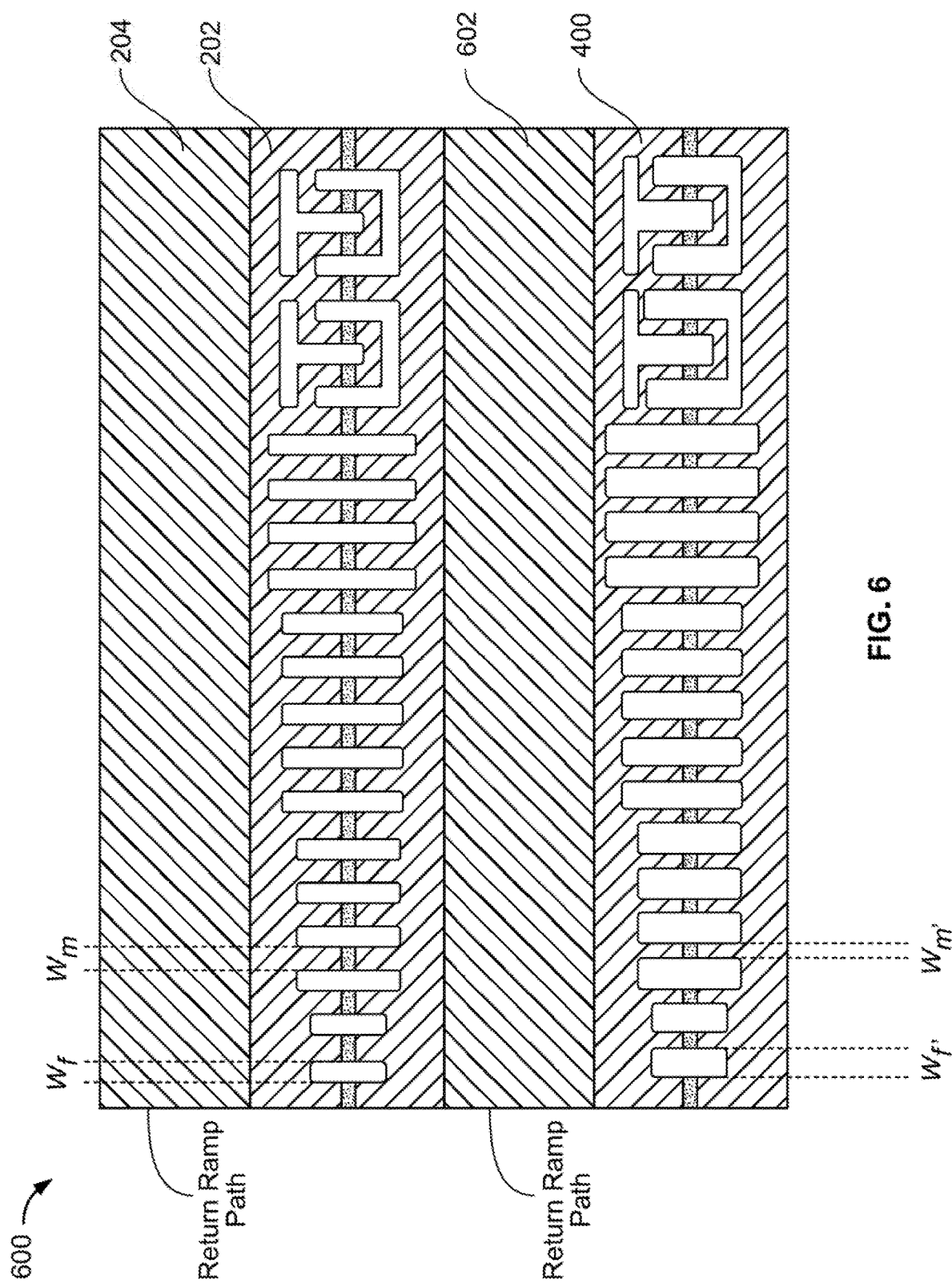
FIG. 6 illustrates a device including the hybrid array of FIG. 2 and a second hybrid array in accordance with aspects of the present disclosure.

FIG. 6 illustrates a device 600 including hybrid array 200 and a second hybrid array in accordance with aspects of the present disclosure. As shown in the figure, the second hybrid array includes array portion 400 and a return ramp path 602. As discussed above with reference to FIG. 4, array portion 400 provides different $\beta_L$ values as compared to hybrid array 202 as a result of the differences in the feature width and material width. Device 600 is therefore operable to provide a more sensitive detection as a result of the multiple different hybrid arrays.

Return ramp path 602 is a bus for each biasing current from each line (not shown) in array portion 400 and operates in a manner similar to return ramp path 204. Changes in the voltage output of each SQUID in parallel array portion 400 then contributes to the net voltage across the parallel SQUID array in array portion 400 in a known manner that provides an absolute measure of the local magnetic field. Subsequently, changes in the voltage across array portion 400 may therefor indicate a magnitude of a detected magnetic field (or electromagnetic signal).

In the non-limiting example embodiments discussed above with reference to FIGS. 1-6, the populations of SQUIDs are arranged such that the $\beta_L$ values increase, for example as shown in FIG. 2, from left to right. It should be noted that in other embodiments, the populations of SQUIDs may be arranged in any order of $\beta_L$ values, so long as the populations sizes have respective varying $\beta_L$, values to fit a curve to address high linearity of the V-Φ characteristic SQUID array response, and wherein the largest population has a $\beta_L$ value at the peak of the curve. For example, one example embodiment may include three populations of SQUIDs, wherein the associated $\beta_{L1}$, $\beta_{L2}$ and $\beta_{L3}$ values are distributed in one of a log-normal distribution and a Gaussian distribution, and wherein a peak of the one of the log-normal distribution and the Gaussian distribution is centered on $\beta_{L2}$.

In the non-limiting example embodiments discussed above with reference to FIGS. 1-6, an array includes both SQUIDs and bi SQUIDs. It should be noted that in accordance with aspects of the present disclosure an array may include only a plurality of SQUIDs or only a plurality of bi-SQUIDs.

Figure 7:
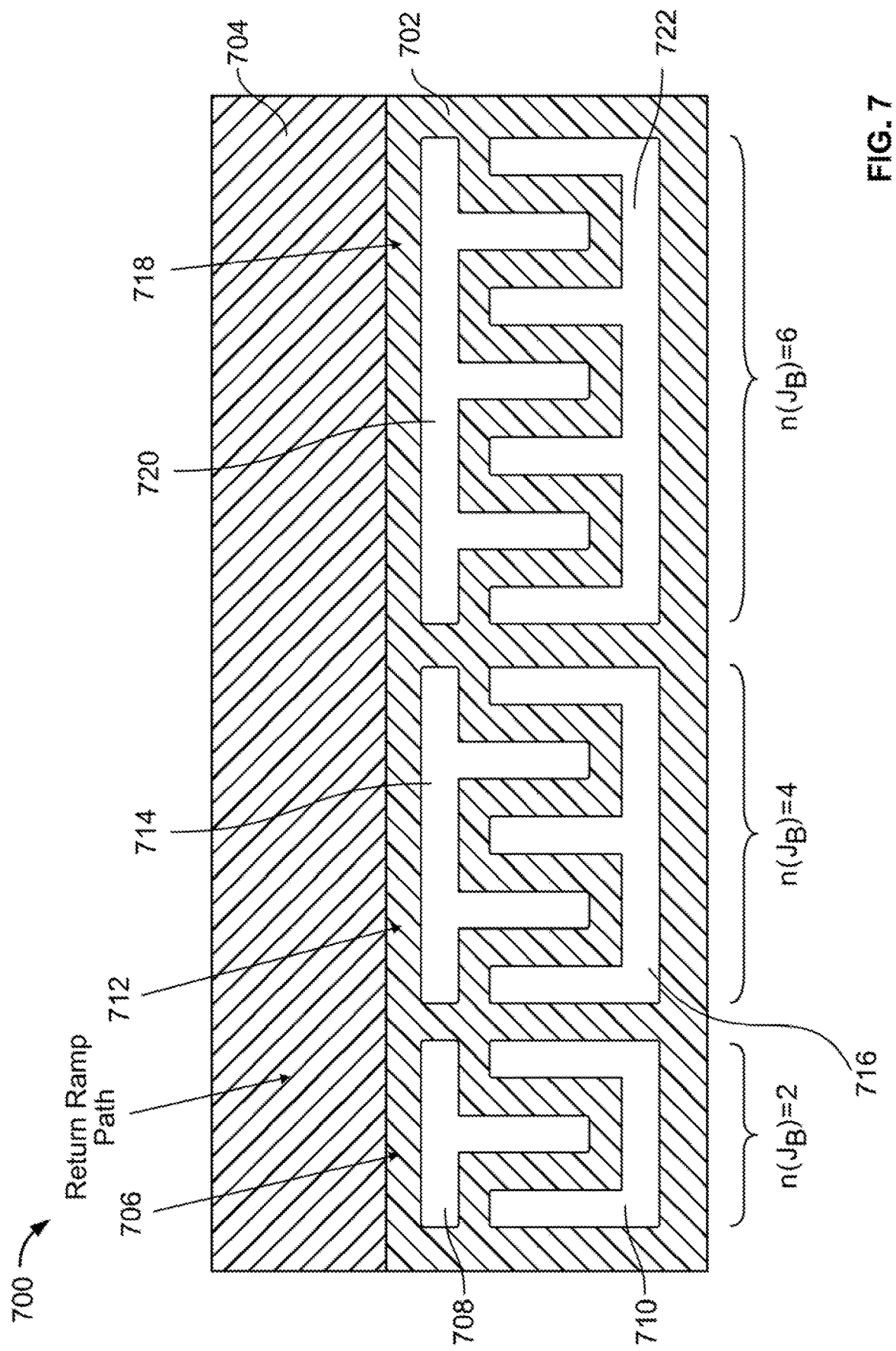
FIG. 7 illustrates an example embodiment of an array 700 of bi-SQUIDs in accordance with aspects of the present disclosure.

Bi-SQUID arrays with even higher effective $\beta_L$ values can be achieved by incorporating more bisecting Josephson junctions, $J_B$, on the cross-loop path (denoted as having a critical current $I_{c3}$) as shown in FIG. 7.

FIG. 7 illustrates an example embodiment of an array 700 of bi-SQUIDs in accordance with aspects of the present disclosure. As shown in the figure, array 700 includes an array portion 702 and a return ramp path 704. Array portion 702 includes: a bi-SQUID 706 having a t-shaped SQUID feature 708 and a u-shaped SQUID feature 710; a bi-SQUID 712 having a double t-shaped SQUID feature 714 and a w-shaped SQUID feature 716; and a bi-SQUID 718 having a triple t-shaped SQUID feature 720 and a triple u-shaped SQUID feature 722.

In this example, bi-SQUID 712 has a central (on a Gaussian distribution) effective geometric magnetic inductance parameter value, $\beta_{L*}$. On the other hand, bi-SQUID 706 has an effective geometric magnetic inductance parameter value, $\beta_{L*}$ minus an amount $\delta^*$, whereas bi-SQUID 718 has an effective geometric magnetic inductance parameter value, $\beta_{L*}$ plus the amount $\delta^*$.

The method of incorporating bi-SQUIDs having higher effective geometric inductances solves the fabrication limitation inherent to the photolithographic process that is commonly used within the high-temperature superconducting circuit fabrication community. The approach may also be extended to encompass SQUID arrays formed via non-photolithographic processes that are used to form high-$T_c$ Josephson junctions, e.g., ion-damage, ion-milling, bi-crystal, etc., as well as to SQUID arrays made from other kinds of superconducting materials, e.g., niobium, that can be processed to form Josephson junctions.

As discussed above, an aspect of the present disclosure is drawn to large magnetic inductance parameter values made possible by bi-SQUID structures, while maintaining feature dimensions necessary to achieve SQUID structures, having magnetic inductance parameter values $\beta_L$ that are an order of magnitude smaller. It is the order of magnitude spread in inductance parameter values $\beta_L$ in concert with a Gaussian (log-normal, etc.,) distribution (population count) that enables the fabrication of SQUID arrays that have improved performance characteristics such as having highly linear magnetic field to voltage, V-B, transfer functions (also referred to as the anti-peak), reduced side lobes on the transfer function (the oscillations away from the anti-peak), and increased dV/dB (slope of the anti-peak, which determines the field sensitivity). It is known that the anti-peak is a result of having a sufficient spread in the values of the magnetic inductance parameters $\beta_L$, and that the nature of the distribution (Gaussian, log-normal, etc.), has an effect on the linearity of the V-B transfer function. However is conventionally very difficult to actually fabricate such SQUID arrays because of the limitations inherently imposed by the lithographic process—as described above. It is the structures and methods in accordance with aspects of the present disclosure as discussed above with reference to FIGS. 2-7 enable such a sufficient spread in the values of the magnetic inductance parameters $\beta_L$.

The foregoing description of various embodiments has been presented for purposes of illustration and description. It is not intended to be exhaustive or to limit the disclosure to the precise forms disclosed, and obviously many modifications and variations are possible in light of the above teaching. The example embodiments, as described above, were chosen and described in order to best explain the principles of the disclosure and its practical application to thereby enable others skilled in the art to best utilize the disclosure in various embodiments and with various modifications as are suited to the particular use contemplated. It is intended that the scope of the disclosure be defined by the claims appended hereto.

What is claimed as new and desired to be protected by Letters Patent of the United States is:

1. A device comprising:
a substrate;
a first superconducting quantum interference device disposed on said substrate, said first superconducting interference device having a first feature dimension, a second feature dimension and a first effective geometric magnetic inductance parameter value, $\beta_{L1}$;
a second superconducting quantum interference device disposed on said substrate, said second superconducting interference device having the first feature dimension, a third feature dimension and a second effective geometric magnetic inductance parameter value, $\beta_{L2}$; and
a third superconducting quantum interference device disposed on said substrate, said third superconducting interference device having the first feature dimension, a fourth feature dimension and a third effective geometric magnetic inductance parameter value, $\beta_{L3}$, wherein $\beta_{L1} < \beta_{L2} < \beta_{L3}$.

2. The device of claim 1, wherein said second superconducting quantum interference device is disposed between said first superconducting quantum interference device and said third superconducting quantum interference device.

3. The device of claim 2, wherein said first superconducting quantum interference device, said second superconducting quantum interference device and said third superconducting quantum interference device are linearly disposed.

4. The device of claim 3, wherein said third superconducting quantum interference device comprises three Josephson junctions.

5. The device of claim 4, wherein said second superconducting quantum interference device comprises three Josephson junctions.

6. The device of claim 5, wherein said first feature dimension comprises a width of a region of etched material.

7. The device of claim 5, wherein said first feature dimension comprises a width between two adjacent regions of etched material.

8. The device of claim 1, wherein said first superconducting quantum interference device, said second superconducting quantum interference device and said third superconducting quantum interference device are linearly disposed.

9. The device of claim 8, wherein said third superconducting quantum interference device comprises three Josephson junctions.

10. The device of claim 9, wherein said second superconducting quantum interference device comprises three Josephson junctions.

11. The device of claim 10, wherein said first feature dimension comprises a width of a region of etched material.

12. The device of claim 10, wherein said first feature dimension comprises a width between two adjacent regions of etched material.

13. The device of claim 11, wherein said first feature dimension comprises a width between two adjacent regions of etched material.

14. The device of claim 1, wherein said third superconducting quantum interference device comprises three Josephson junctions.

15. The device of claim 14, wherein said second superconducting quantum interference device comprises three Josephson junctions.

16. The device of claim 15, wherein said first feature dimension comprises a width of a region of etched material.

17. The device of claim 15, wherein said first feature dimension comprises a width between two adjacent regions of etched material.

18. The device of claim 1, wherein said first feature dimension comprises a width of a region of etched material.

19. A method of fabricating a device, said method comprising:
fabricating a substrate;
disposing a superconducting material on the substrate;
creating, on the substrate, a first superconducting quantum interference device having a first feature dimension, a second feature dimension and a first effective geometric magnetic inductance parameter value, $\beta_{L1}$;
creating, on the substrate, a second superconducting quantum interference device having the first feature dimension, a third feature dimension and a second effective geometric magnetic inductance parameter value, $\beta_{L2}$; and
creating, on the substrate, a third superconducting quantum interference device having the first feature dimension, a fourth feature dimension and a third effective geometric magnetic inductance parameter value, $\beta_{L3}$, wherein $\beta_{L1} < \beta_{L2} < \beta_{L3}$.

20. A device comprising:
a substrate;
a first superconducting quantum interference device disposed on said substrate, said first superconducting interference device having a first feature dimension, a second feature dimension and a first effective geometric magnetic inductance parameter value, $\beta_{L1}$;
a second superconducting quantum interference device disposed on said substrate, said second superconducting interference device having the first feature dimension, a third feature dimension and a second effective geometric magnetic inductance parameter value, $\beta_{L2}$; and
a third superconducting quantum interference device disposed on said substrate, said third superconducting interference device having the first feature dimension, a fourth feature dimension and a third effective geometric magnetic inductance parameter value, $\beta_{L3}$,
wherein $\beta_{L1}$, $\beta_{L2}$ and $\beta_{L3}$ are distributed in one of a Gaussian distribution and a Gaussian equivalent non-uniform distribution, and
wherein a peak of the one of the Gaussian distribution and the Gaussian equivalent non-uniform distribution is centered on $\beta_{L2}$.

* * * * *